(12) United States Patent
Variot et al.

(10) Patent No.: US 12,394,728 B2
(45) Date of Patent: Aug. 19, 2025

(54) METHOD OF FORMING A REGION SHIELDING WITHIN A PACKAGE OF A MICROELECTRONIC DEVICE

(71) Applicant: Adeia Semiconductor Technologies LLC, San Jose, CA (US)

(72) Inventors: Patrick Variot, Los Gatos, CA (US); Hong Shen, Palo Alto, CA (US)

(73) Assignee: Adeia Semiconductor Technologies LLC, San Jose, CA (US)

( * ) Notice: Subject to any disclaimer, the term of this patent is extended or adjusted under 35 U.S.C. 154(b) by 0 days.

(21) Appl. No.: 18/673,099

(22) Filed: May 23, 2024

(65) Prior Publication Data

US 2024/0312928 A1   Sep. 19, 2024

Related U.S. Application Data

(62) Division of application No. 17/509,887, filed on Oct. 25, 2021, now Pat. No. 12,021,041.

(60) Provisional application No. 63/108,096, filed on Oct. 30, 2020.

(51) Int. Cl.
*H01L 23/552* (2006.01)
*H01L 23/31* (2006.01)
*H01L 23/522* (2006.01)

(52) U.S. Cl.
CPC ............ *H01L 23/552* (2013.01); *H01L 23/31* (2013.01); *H01L 23/5226* (2013.01)

(58) Field of Classification Search
CPC ........... H01L 2924/3025; H01L 23/552; H01L 21/56; H01L 23/5226; H01L 2224/48227; H01L 2224/16227; H01L 25/0655

USPC ......................................................... 257/659
See application file for complete search history.

(56) References Cited

U.S. PATENT DOCUMENTS

| | | | |
|---|---|---|---|
| 8,030,770 B1 | 10/2011 | Juskey et al. | |
| 2006/0258050 A1* | 11/2006 | Fujiwara ................. | H01L 23/29 257/E23.117 |
| 2009/0072357 A1 | 3/2009 | Tang et al. | |
| 2009/0302438 A1 | 12/2009 | Chauhan et al. | |
| 2012/0008288 A1* | 1/2012 | Tsukamoto .......... | H05K 9/0037 361/736 |
| 2017/0179041 A1* | 6/2017 | Dias ...................... | H01L 21/561 |
| 2017/0301631 A1 | 10/2017 | Lee et al. | |
| 2018/0240759 A1* | 8/2018 | Haji-Rahim ...... | H01L 23/53223 |
| 2018/0374798 A1* | 12/2018 | Lee ........................ | H01L 23/552 |

(Continued)

FOREIGN PATENT DOCUMENTS

WO         2016/181954 A1    11/2016

*Primary Examiner* — Didarul A Mazumder
(74) *Attorney, Agent, or Firm* — Haley Guiliano LLP

(57) ABSTRACT

A microelectronic device may include a substrate, a first chip on the substrate, and a second chip on the substrate. A plurality of pillars may be located between the first chip and the second chip, wherein a first end of each pillar of the plurality of pillars is adjacent to the substrate. A spacing among the plurality of pillars is at least equal to a distance sufficient to block electromagnetic interference (EMI) and/ or radio frequency interference (RFI) between the first chip and the second chip. The microelectronic device may also include a cover over at least the first chip, the second chip, and the plurality of pillars, wherein a second end of each pillar of the plurality of pillars is at least adjacent to a trench defined within the cover. The trench may include a conductive material therein.

12 Claims, 7 Drawing Sheets

(56) References Cited

U.S. PATENT DOCUMENTS

2019/0115305 A1    4/2019  Lin
2019/0393166 A1*  12/2019  Otsubo ................. H01L 23/552

* cited by examiner

200

```
┌─────────────────────────────────────────────────────────────────────┐
│ PROVIDE A SUBSTRATE COMPRISING A CONDUCTIVE TRACE AND A PLURALITY OF│─ 202
│ PILLARS, WHEREIN A FIRST END OF EACH PILLAR OF THE PLURALITY OF     │
│ PILLARS IS COUPLED TO THE SUBSTRATE                                 │
└─────────────────────────────────────────────────────────────────────┘
                                   │
                                   ▼
┌─────────────────────────────────────────────────────────────────────┐
│ ATTACH A FIRST CHIP TO THE SUBSTRATE ADJACENT TO A FIRST SIDE OF THE│─ 204
│ PILLARS                                                             │
└─────────────────────────────────────────────────────────────────────┘
                                   │
                                   ▼
┌─────────────────────────────────────────────────────────────────────┐
│ ATTACH A SECOND CHIP TO THE SUBSTRATE ADJACENT TO A SECOND SIDE OF  │─ 206
│ THE PILLARS, WHEREIN THE SECOND SIDE IS OPPOSITE TO THE FIRST SIDE  │
└─────────────────────────────────────────────────────────────────────┘
                                   │
                                   ▼
┌─────────────────────────────────────────────────────────────────────┐
│ DISPOSE AN EPOXY MOLDING COMPOUND OVER AT LEAST THE FIRST CHIP, THE │─ 208
│ SECOND CHIP, AND THE PLURALITY OF PILLARS TO PROVIDE A COVER        │
└─────────────────────────────────────────────────────────────────────┘
                                   │
                                   ▼
┌─────────────────────────────────────────────────────────────────────┐
│ FORM A TRENCH IN THE COVER, WHEREIN A SECOND END OF EACH PILLAR OF  │
│ THE PLURALITY OF PILLARS IS AT LEAST ADJACENT TO THE TRENCH DEFINED │
│ WITHIN THE COVER, AND WHEREIN A SPACING AMONG THE PLURALITY OF      │─ 210
│ PILLARS IS AT LEAST EQUAL TO A DISTANCE SUFFICIENT TO BLOCK ONE OR  │
│ MORE OF (I) ELECTROMAGNETIC INTERFERENCE (EMI) OR RADIO FREQUENCY   │
│ INTERFERENCE (RFI) BETWEEN THE FIRST CHIP AND THE SECOND CHIP       │
└─────────────────────────────────────────────────────────────────────┘
```

FIG. 2

METHOD OF FORMING A REGION SHIELDING WITHIN A PACKAGE OF A MICROELECTRONIC DEVICE

CROSS-REFERENCE TO RELATED APPLICATIONS

This patent application is a division of U.S. patent application Ser. No. 17/509,887, filed Oct. 25, 2021, which claims benefit to U.S. Patent Provisional Application No. 63/108,096, filed Oct. 30, 2020, which are fully incorporated herein by reference in their entireties.

BACKGROUND

Microelectronic devices often include multiple microelectronic elements, e.g., dies or chips. The microelectronic elements may be active or passive. There is a need for protecting the microelectronic elements from electromagnetic interference (EMI) and/or radio frequency interference (RFI) that may be caused by other microelectronic elements in a microelectronic device.

One technique for providing EMI and/or RFI protection among microelectronic elements includes a conductive trace within a substrate of the microelectronic device package. Wires may extend from the conductive trace between microelectronic elements and the conductive trace and/or wires may be grounded. The wires may be arranged as a fence around individual microelectronic elements to isolate the microelectronic elements from other microelectronic elements for shielding from EMI and/or RFI.

Another technique for providing EMI and/or RFI protection among microelectronic elements includes a solid conductive wall that may be formed between and/or around individual microelectronic elements to isolate the microelectronic elements from other microelectronic elements for shielding from EMI and/or RFI. The wall may comprise a conductive material that engages a conductive trace within the substrate of the microelectronic device package to ground the conductive wall.

Utilizing the first, "wire" technique may be time consuming in creating the microelectronic device package. Additionally, the wires may be fragile and thus, may bend and even break easily. This leads to greater costs and time in creating the microelectronic device. When the second, "wall" technique is utilized, the wall extends all the way to the conductive trace. Thus, when the microelectronic device is being encapsulated, e.g., the cover is being created, the encapsulation material cannot flow through the wall. This may create unbalanced pressure during molding, which may ultimately create encapsulation defects such as, for example, voids, un-fill, etc. This also leads to greater costs and time in creating the microelectronic device.

Furthermore, when dies are wire bonded on the substrate, adding a fence of wire at the same time might not be an issue with respect to the overall manufacturing process since it involves the same wire bond process. However, in the case of using flip chip interconnect during the manufacturing process, switching to a wire bonder to stitch wires to provide EMI and/or RFI protection may create issues. For example, requiring a bonder for a flip chip process may require adding extra steps or tooling since wire bonds may not otherwise be involved.

BRIEF DESCRIPTION OF THE DRAWINGS

The detailed description is set forth below with reference to the accompanying figures. In the figures, the left-most digit(s) of a reference number identifies the figure in which the reference number first appears. The use of the same reference numbers in different figures indicates similar or identical items. The systems depicted in the accompanying figures are not to scale and components within the figures may be depicted not to scale with each other.

FIG. 2 illustrates a flow diagram of an example method of manufacturing a microelectronic device, such as the microelectronic device of FIGS. 1A-1F, in accordance with various configurations.

DETAILED DESCRIPTION

Overview

Figure 1A:
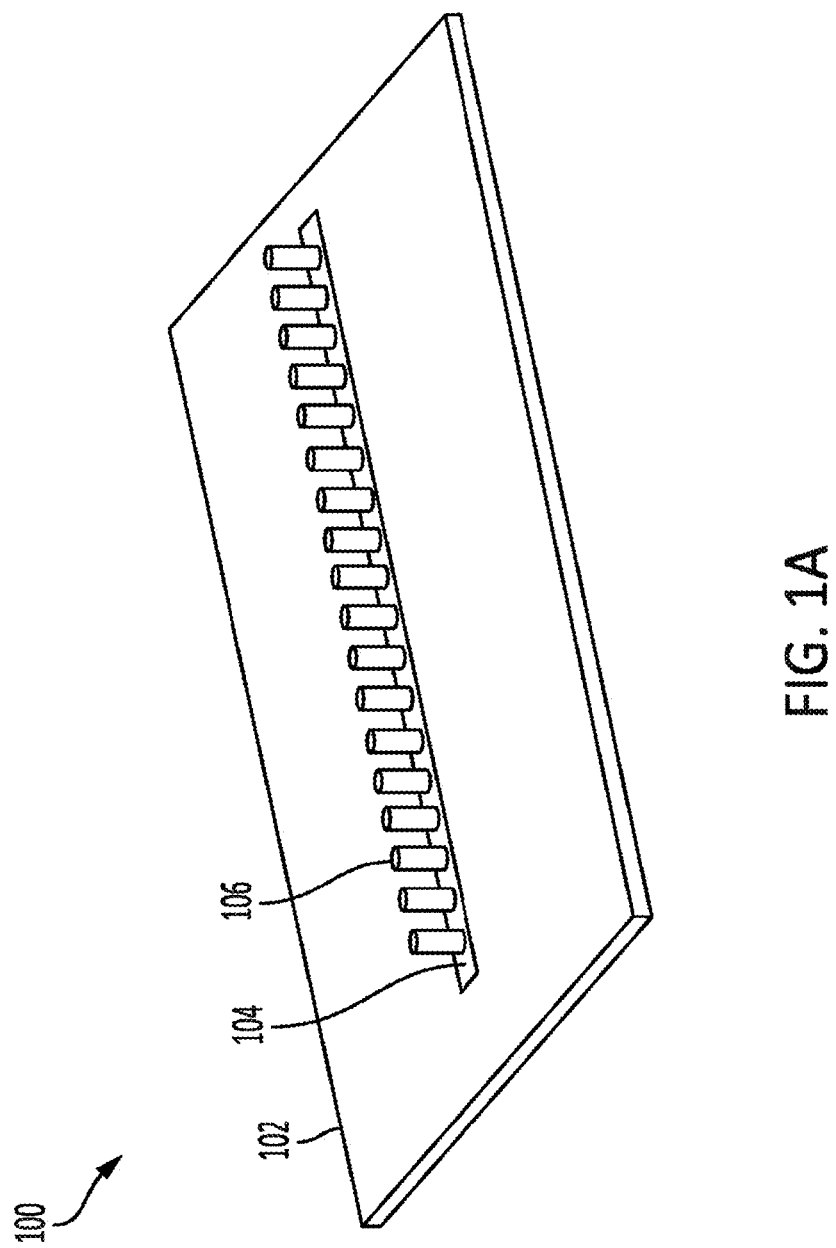
FIGS. 1A-1F schematically illustrates an example of a microelectronic device during various stages of manufacture, in accordance with various configurations.

This disclosure describes example techniques for shielding regions of a package (or the entire package) of a microelectronic device from EMI and/or RFI, where the regions include microelectronic elements. The techniques provide a plurality of pillars comprising conductive material that are coupled to a conductive trace exposed in a substrate of the microelectronic device. The conductive pillars separate a first die from a second die and provide EMI and/or RFI shielding between the two dies.

In accordance with various configurations, a microelectronic device may include a substrate. The substrate may include an electrically conductive element in the form of a conductive trace comprising a conductive material exposed within a surface of the substrate, where the conductive trace is in contact with a grounding plane. In configurations, the substrate may include an electrically conductive element in the form of a row of pads (in place of the conductive trace) comprising a conductive material exposed within a surface of the substrate, where the row of pads are in contact with a grounding plane. In configurations, the grounding plane may be replaced with one or more grounding vias. Pillars or posts may extend from the conductive trace (or row of pads) linearly in a row, with a first end of each pillar adjacent to the substrate and in contact with the conductive trace. In configurations, the first ends of the pillars may be integral with the conductive trace (or pads of the row of pads). The pillars may comprise a conductive material. In configurations, the conductive material of the pillars is the same as the conductive material of the conductive trace (or row of pads). In other configurations, the conductive material of the pillars the conductive material of the conductive trace (or row of pads) are different conductive materials. The pillars are thereby grounded by the conductive trace.

One or more microelectronic elements, e.g., dies or chips, may be placed on each side of the pillars. For example, a first die may be placed on a first side of the row of pillars while a second die may be placed on the opposite side of the row of pillars. The dies may be connected to the substrate via a wire bonding process or may be flip chip attached to the substrate. In configurations, the pillars may be arranged such that the pillars surround, or at least substantially surround, a die. For example, pillars may be arranged around the first die and pillars may be arranged around the second die. In configurations, more than two dies may be included in the microelectronic device.

After the dies are attached to the substrate, an encapsulation step may be performed to provide a cover for the microelectronic device. The encapsulation step may include encapsulating or molding components, including the first and second dies, on the substrate. Due to the spacing between the pillars, the molding material is able to flow between the pillars and around components on the substrate. Thus, components, including the pillars, on the substrate are encapsulated during the encapsulation process.

In configurations, after encapsulation, the cover of the microelectronic device may be trenched, e.g., a saw, a laser, a waterjet, etc., may be utilized to create a trench in the cover. In other configurations, a fin may be utilized during the encapsulation step. In such configurations, after the encapsulation step, the fin may be removed, thereby providing the trench.

After the trench is created, the trench may be filled with a conductive material and a coating or layer of the conductive material may be placed on at least a top surface of the cover, e.g., an outer surface of the cover. In configurations, the coating or layer of conductive material may extend on the sides of the cover. In configurations, the conductive material in the trench and the conductive coating on the top, and possibly sides, of the cover are the same material. In other configurations, the conductive material in the trench and the conductive coating on the top, and possibly sides, of the cover are different conductive materials.

In configurations, the conductive material in the trench may extend to a second end of each pillar to provide flexible-in-package-shielding (FIPS), e.g., the second end is opposite (remote) from the first end of each pillar that engages the conductive trace. In some configurations, the conductive material in the trench, e.g., a bottom surface of the conductive material, may engage one or more of the tops, e.g., second ends, of the pillars. In other configurations, the conductive material in the trench, e.g., the bottom surface of the conductive material, may not engage the tops of one or more of the pillars.

Thus, the pillars and the conductive material in the trench provide EMI and/or RFI protection between the dies that are located on opposite sides of the row of pillars. In configurations, the spacing between the pillars is at least equal to a distance sufficient to block electromagnetic interference between the two dies, e.g., the first die located on one side of the row of pillars and the second die located on the opposite side of the row of pillars. In configurations, the spacing of the pillars is less than the distance sufficient to block electromagnetic interference between the first die and the second die, i.e., the spacing of the pillars is less than the maximum distance that allows the pillars to block electromagnetic interference between the first die and the second die. In configurations, the spacing among the pillars may be in a range of 5 micrometers to 50 micrometers. Additionally, in configurations, the spacing between the first die and the second die is in a range of 100 microns to 2000 microns. Also, in configurations, the row of pillars is integral, e.g., part of, the conductive trace. In other configurations, the pillars are formed on, e.g., coupled to, the conductive trace.

In configurations, the conductive trace and row of pillars may be formed during a substrate formation process. Thus, the substrate may be provided by a substrate manufacturer with a pre-formed conductive trace and pre-formed pillars. The die coupling (and other component placement) processes and encapsulation process may thus be performed on such a provided substrate.

Utilizing the techniques provided herein when making microelectronic devices, processing time when creating the trench is reduced since the trench does not extend as deep into the cover of prior art microelectronic devices. This may result in a monetary savings. Additionally, in configurations, the trench may not be filled with a separate conductive filler. A conductive paint on the trench may be utilized instead. Additionally, the techniques provided herein provide better shielding protection than spaced wires up to the top of the package cover.

Additionally, the trench does not extend all the way to the substrate and thereby does not expose the substrate. This may improve reliability of the microelectronic devices and may lead to less moisture ingress. Furthermore, since the trench does not extend all the way to the substrate, increased mechanical robustness of microelectronic devices may be realized, which may result in less packaging/thin substrate cracks generally caused by bending.

Also, in configurations, the pillars may be formed using established circuit board batch processes that can result in time savings as well as monetary savings. Furthermore, utilizing the techniques described herein does not require wire stitching and the pillars are physically more stable than wires, which can result in a higher assembly yield and additional monetary savings.

Additionally, the techniques described herein provide a flexible trenching shape and location for flexible-in-package-shielding (FIPS). For example, the pillars and trench do not necessarily need to be linear but rather simply need a shape and/or location to provide EMI and/or RFI shielding among microelectronic elements. Thus, internal die/passive-to-die/passive shielding with respect to EMI and/or RFI, as well as external shielding from other components, is flexible for the microelectronic devices. The package design and layout of the microelectronic devices may therefore dictate the arrangement of the pillars and the trench. Additionally, by utilizing the fin process during creation of the encapsulation cover, extra trenching, e.g., cutting of the encapsulation to create the trench, may be limited, thereby saving time and/or material.

EXAMPLE EMBODIMENTS

FIG. 1A schematically illustrates a substrate 102 for a microelectronic device 100. The substrate 102 may include a conductive trace 104 comprising a conductive material exposed within a surface of the substrate 102, where the conductive trace 104 is in contact with a grounding plane (not illustrated) of the substrate 102. In configurations, the conductive trace 104 may be replaced with a row of conductive pads (not illustrated) comprising a conductive material exposed within a surface of the substrate 102, where the row of conductive pads is in contact with a grounding plane (not illustrated) of the substrate 102. Pillars or posts 106 may extend from the conductive trace 104 linearly in a row. The pillars 106 may comprise a conductive material. As an example, the conductive material of the conductive trace 104 and the pillars 106 may comprise copper and alloys thereof. In configurations, the conductive material of the pillars 106 is the same as the conductive material of the conductive trace 104. However, in other configurations the pillars 106 and conductive trace 104 may comprise different conductive materials. The pillars 106 are thus grounded by the conductive trace 104 via the grounding plane. In configurations, the conductive trace 104 and the row of pillars 106 may be formed during a substrate formation process. Thus, the substrate 102 may be provided by a substrate manufacturer with a pre-formed conductive trace 104 and pre-formed pillars 106.

Figure 1B:
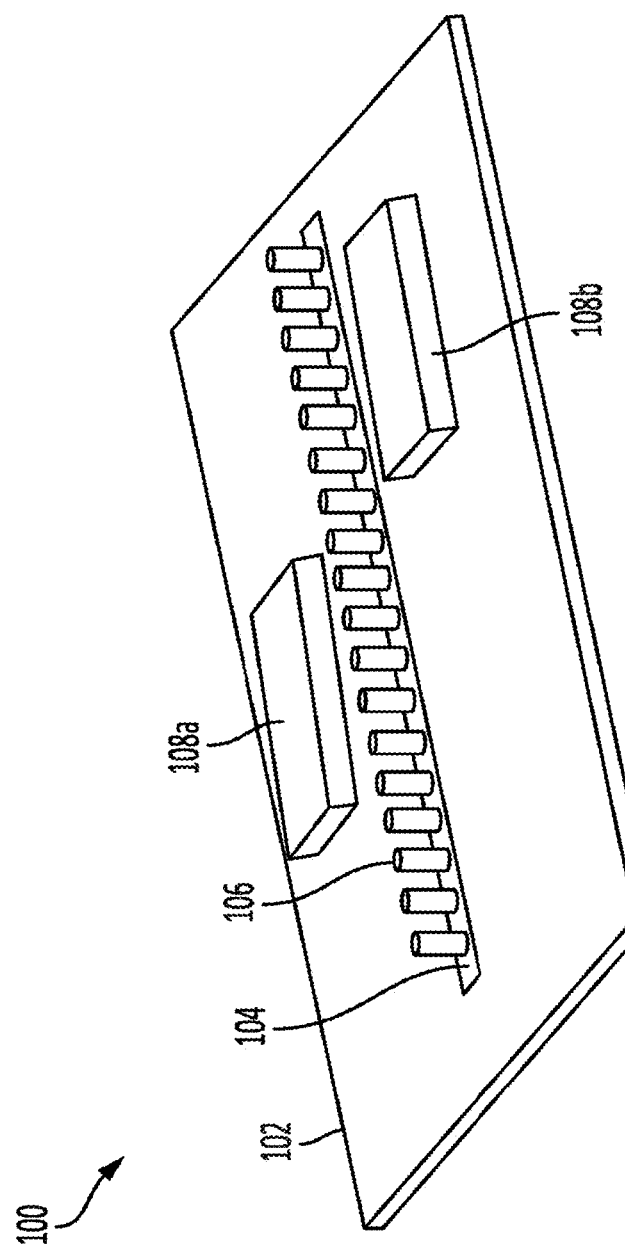

FIG. 1B schematically illustrates the substrate 102 with two dies 108*a*, 108*b*, e.g., microelectronic elements or chips, placed on opposite sides of the pillars 106. The dies or chips 108*a*, 108*b* may be active components or may be passive components. For example, a first die 108*a* may be placed on a first side of the row of pillars 106 while a second die 108b may be placed on the opposite side of the row of pillars 106. The dies 108a, 108b may be connected to the substrate 102 via a wire bonding process or may be flip chip attached to the substrate 102. In configurations, the pillars 106 may be arranged such that the pillars surround, or at least substantially surround, one or both dies 108a, 108b, e.g., the pillars 106 may be arranged similar to a fence. For example, pillars 106 may be arranged around the first die 108a and pillars 106 may be arranged around the second die 108b. In configurations, more than two dies 108 may be included in the microelectronic device 100.

Figure 1C:
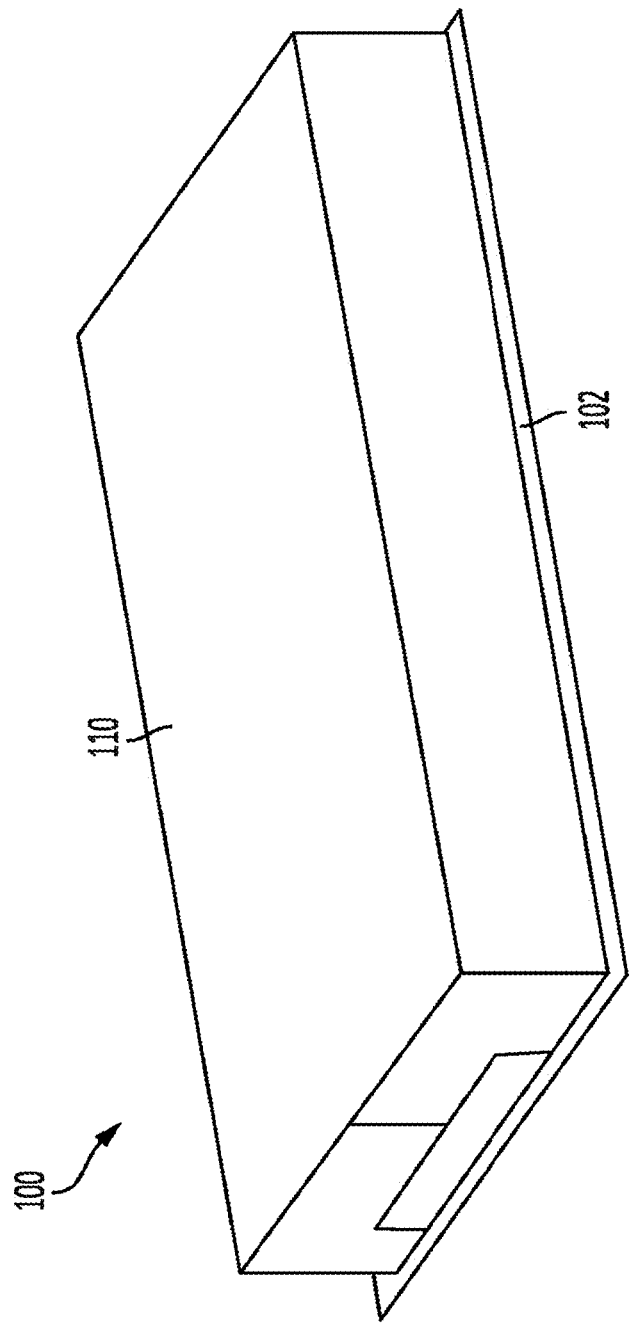

Referring to FIG. 1C, after the dies 108a, 108b are attached to the substrate 102, an encapsulation step may be performed to provide a cover in the form of a dielectric encapsulation layer 110 for the microelectronic device 100. The encapsulation step may include encapsulating or molding components with a dielectric encapsulation material, e.g., an epoxy molding compound (EMC), including the first and second dies 108a, 108b, on the substrate 102. Thus, components, including the pillars 106, on the substrate 102 are encapsulated during the encapsulation process in the dielectric encapsulation layer.

Figure 1D:
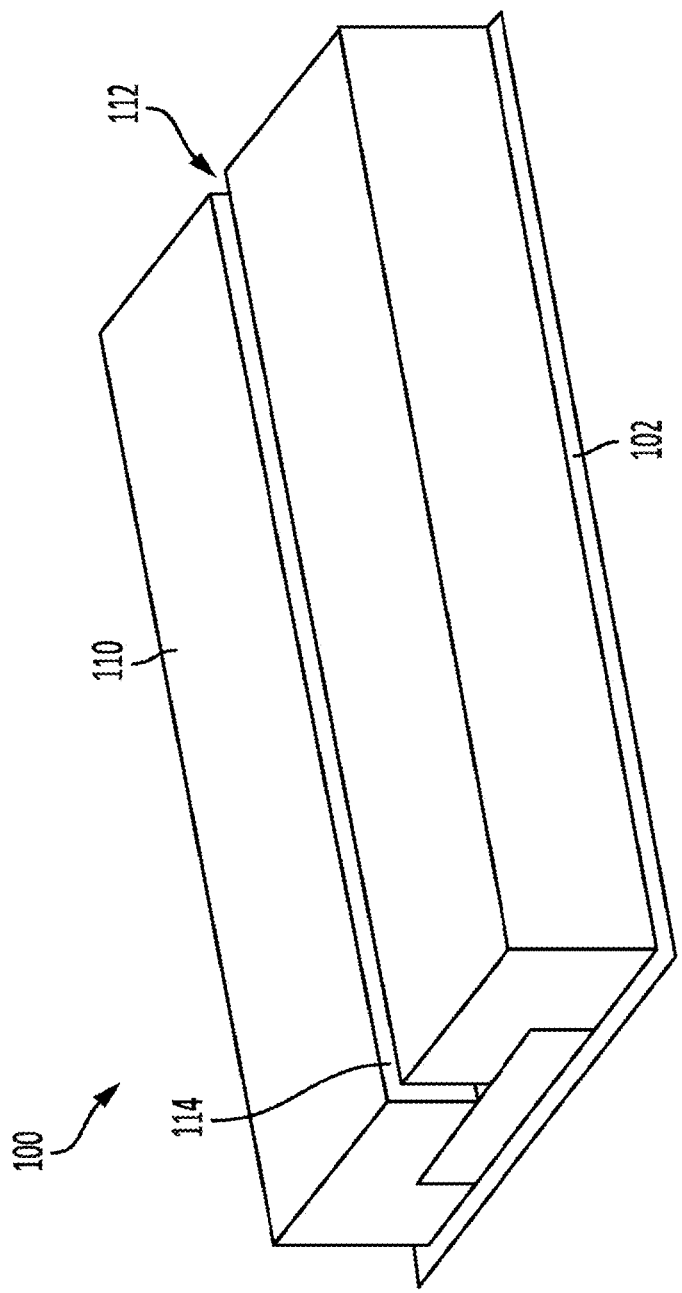

Referring to FIG. 1D, in configurations, after encapsulation, the cover of the microelectronic device may be trenched, e.g., a saw, a laser, a waterjet, etc., may be utilized to create a trench 112 in the cover. In other configurations, a fin 114 may be utilized during the encapsulation step. In such configurations, after the encapsulation step, the fin 114 may be removed, thereby providing the trench 112. When the fin 114 is used, due to the spacing between the pillars 106, flow of the molding material between the pillars 106 and around components on the substrate 102 may be improved.

Figure 1E:
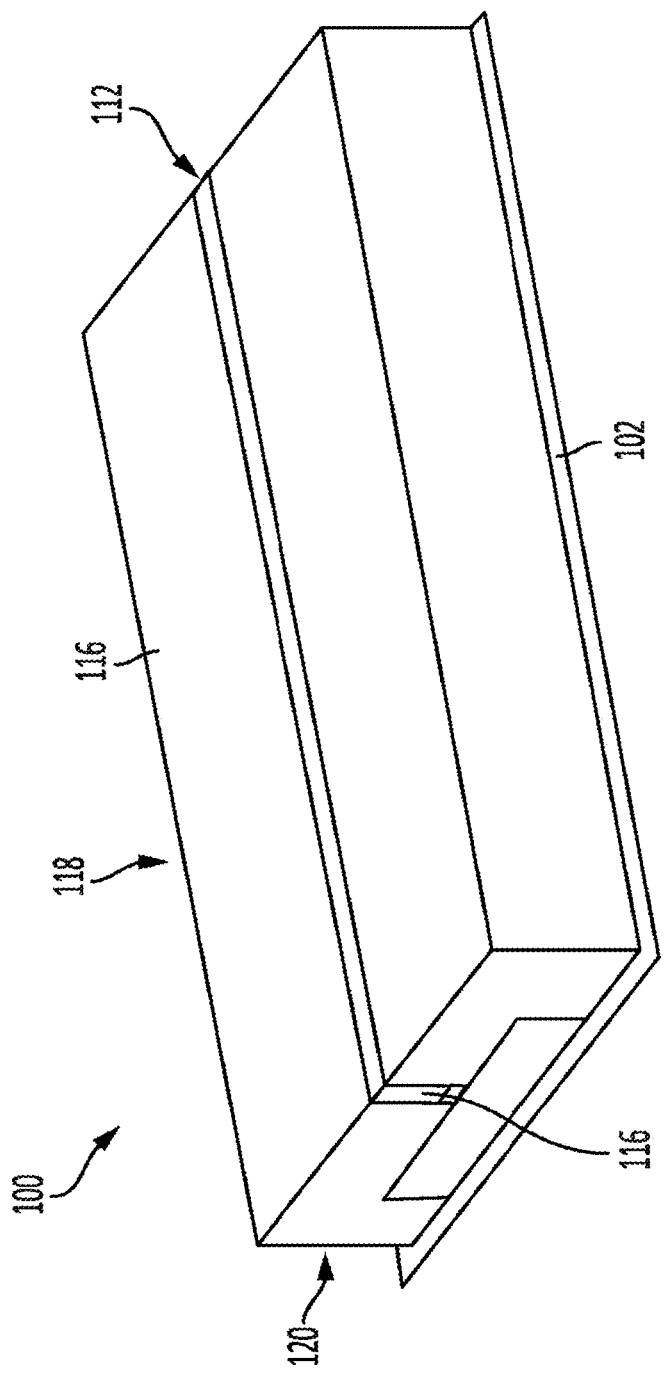
Figure 1F:
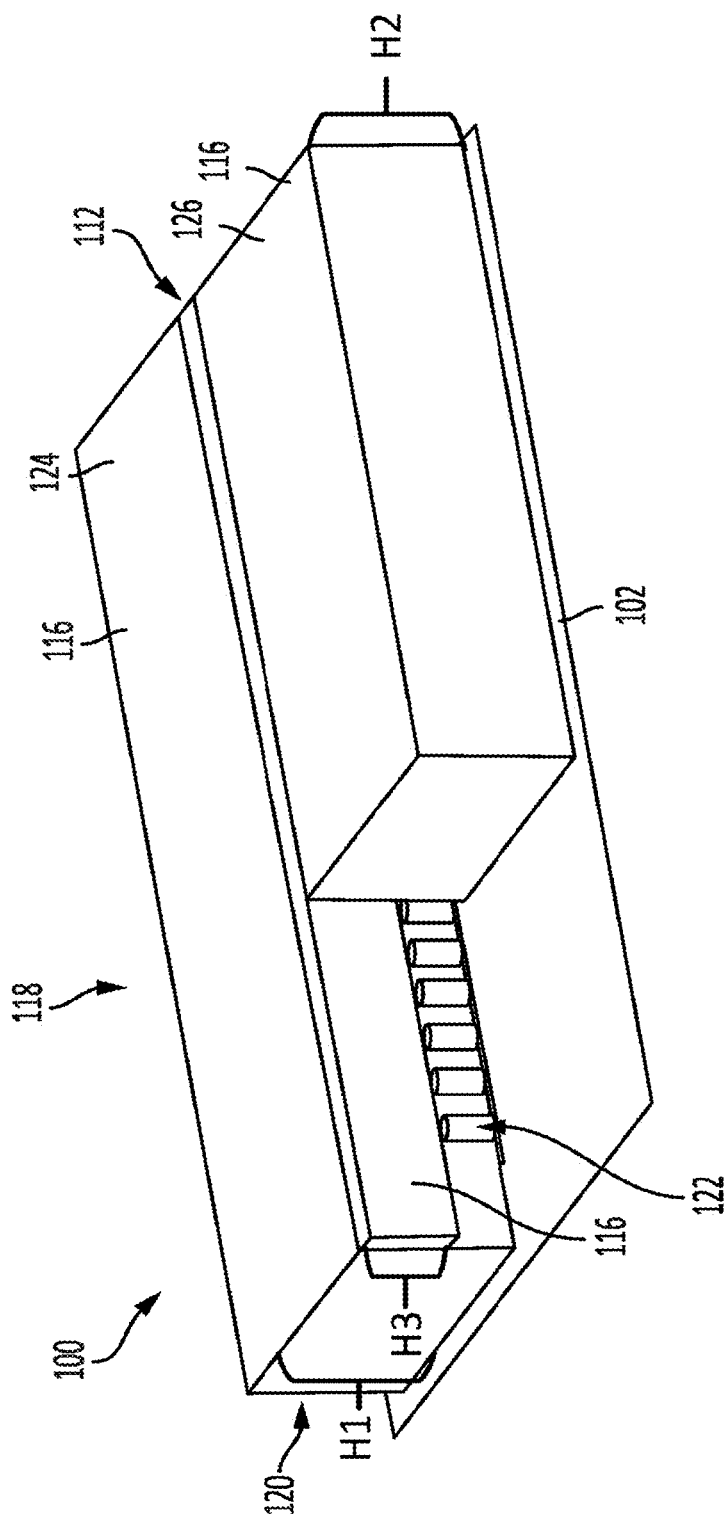

Referring to FIG. 1E, after the trench 112 is created, the trench 112 may be filled with a conductive material 116. A coating 118 of the conductive material 116 may be placed on at least a top surface of the cover 110. The filling of the trench 112 and/or the coating of the cover 110 with the conductive material 116 may be achieved with conductive paint in some configurations. In some configurations, the conductive material 116 may be disposed in the trench 112 and/or as the coating 118 using a different deposition process. In configurations, the coating 118 of conductive material 116 may extend on the sides 120 of the cover 110. In configurations, the conductive material 116 in the trench 112 and the conductive coating 118 on the top, and possibly sides 120, of the cover 110 are the same material. In configurations, the conductive material 116 in the trench 112 and the conductive coating 118 on the top, and possibly sides 120, of the cover 110 may be different conductive materials Referring to FIG. 1F, in configurations, the conductive material 116 in the trench 112 may extend to the pillars 106 to provide flexible-in-package-shielding (FIPS). In some configurations, the conductive material 116 in the trench 112 may not engage the pillars 106. In other configurations, the conductive material 116 filling the trench 112 may engage tops 122 of the pillars 106. Thus, the dielectric encapsulation layer 110 comprises a first portion 124 at a first height H1 above a surface overlying a first region of the substrate 102 that includes the first die 108a (not shown in FIG. 1F), a second portion 126 at a second height H2 above a surface overlying a second region of the substrate 102 that includes the second die 108b (not shown in FIG. 1F), and a third portion, e.g., trench 112 with conductive material 116, at a third height H3 above a surface overlying a third region of the substrate 102 that includes the pillars 106. As can be seen in FIG. 1F, the third height H3 is less than the first height H1 and the second height H2.

Thus, the pillars 106, the conductive material 116 in the trench 112, and/or the coating 118 of the conductive material 116 on at least a top surface of the cover 110 form an interconnected combination that provides a Faraday cage that provides EMI and/or RFI protection between the dies 108a, 108b that are located on opposite sides of the row of pillars 106. The coating 118 of conductive material 116 may also provide external shielding for the microelectronic device 100.

In configurations, the spacing between the pillars 106 is at least equal to a distance sufficient to block electromagnetic interference between the two dies, e.g., the first die 108a located on one side of the row of pillars 106 and the second die 108b located on the opposite side of the row of pillars 106. In configurations, the spacing of the pillars 106 is less than the distance sufficient to block electromagnetic interference between the first die 108a and the second die 108b. In configurations, the spacing among the pillars 106 may be in a range of 5 micrometers to 50 micrometers. Additionally, in configurations, the spacing between the first die 108a and the second die 108b is in a range of 100 microns to 2000 microns. Also, in configurations, the row of pillars 106 is integral, e.g., part of, the conductive trace 104. In other configurations, the pillars 106 are formed on, e.g., coupled to, the conductive trace 104.

Thus, as previously noted, utilizing the techniques provided herein when making microelectronic devices such as microelectronic device 100, processing time when creating the trench 112 is reduced since the trench 112 does not extend as deep into the cover 110 of prior art microelectronic devices. This may result in a monetary savings. Additionally, in configurations, the trench 112 may not be filled with a separate conductive filler. A conductive paint on the trench 112 may be utilized instead when disposing the conductive material 116 on the top surface, and possibly the sides 120, of the cover 110 with conductive paint.

Additionally, the trench 112 does not extend all the way to the substrate 102 and thereby does not expose the substrate 102. This may improve reliability of the microelectronic device 100 and may lead to less moisture ingress. Furthermore, since the trench 112 does not extend all the way to the substrate 102, increased mechanical robustness of the microelectronic device 100 may be realized, which may result in less packaging/thin substrate cracks generally caused by bending.

Also, in configurations, the pillars 106 may be formed using established circuit board batch processes that can result in time savings as well as monetary savings. Furthermore, utilizing the techniques described herein does not require wire stitching and the pillars 106 are physically more stable than wires, which can result in a higher assembly yield and additional monetary savings. Additionally, the techniques provided herein provide better shielding protection than stitched wires up to the top of the cover 110.

Additionally, the techniques described herein provide a flexible trenching shape and location for flexible-in-package-shielding (FIPS). For example, the pillars 106 and the trench 112 do not necessarily need to be linear but rather simply need a shape and/or location to provide EMI and/or RFI shielding among microelectronic elements. Thus, internal die/passive-to-die/passive shielding with respect to EMI and/or RFI, as well as external shielding from other components, is flexible. The package design and layout of the microelectronic devices may therefore dictate the arrangement of the pillars 106 and the trench 112. Additionally, by utilizing the fin process during creation of the encapsulation cover 110, extra trenching, e.g., cutting of the encapsulation to create the trench 112, may be limited, thereby saving time and/or material.

FIG. 2 illustrates a flow diagram of an example method 200 for manufacturing a microelectronic device, e.g., microelectronic device 100. In the flow diagram, the operations of method 200 are shown as individual blocks.

At block 202, a substrate comprising a plurality of pillars and one of (i) a conductive trace or (ii) a plurality of conductive pads is provided, wherein a first end of individual pillars of the plurality of pillars is coupled to one of (i) the conductive trace or (ii) a corresponding conductive pad of a plurality of conductive pads. For example, the substrate may be similar to substrate 102 comprising conductive trace 104 and pillars 106.

At block 204, a first chip is attached to the substrate adjacent to a first side of the pillars. For example, the first die 108a may be attached to the substrate 102 adjacent to a first side of the pillars 106.

At block 206, a second chip is attached to the substrate adjacent to a second side of the pillars, wherein the second side is opposite to the first side. For example, the second die 108b may be attached to the substrate 102 on a second side of the pillars 106.

At block 208, an epoxy molding compound is disposed over at least the first chip, the second chip, and the plurality of pillars to provide a cover. For example, an encapsulation step may be performed to provide the cover 110.

At block 210, a trench is formed in the cover, wherein a second end of each pillar of the plurality of pillars is at least adjacent to the trench defined within the cover, and wherein a spacing among the plurality of pillars is at least equal to a distance sufficient to block one or more of (i) electromagnetic interference (EMI) or radio frequency interference (RFI) between the first chip and the second chip. For example, the trench 112 may be formed in the cover 110. In configurations, the trench 112 may be formed in the cover 110 using the fin 114 during block 208 and thus step 210 may not be performed in such configurations.

At block 212, the trench may be filed with conductive material. For example, the trench 112 may be filled with conductive material 116 such that the pillars 106, the conductive material 116 in the trench 112, and/or the coating 118 of the conductive material 116 on at least atop surface of the cover 110 form an interconnected combination that provides a Faraday cage that provides EMI and/or RFI protection between the dies 108a, 108b that are located on opposite sides of the row of pillars 106.

While the invention is described with respect to the specific examples and configurations, it is to be understood that the scope of the invention is not limited to these specific examples and configurations. Since other modifications and changes varied to fit particular operating requirements and environments will be apparent to those skilled in the art, the invention is not considered limited to the example and configuration chosen for purposes of disclosure and covers all changes and modifications which do not constitute departures from the true spirit and scope of this invention.

Although the application describes configurations and embodiments having specific structural features and/or methodological acts, it is to be understood that the claims are not necessarily limited to the specific features or acts described. Rather, the specific features and acts are merely illustrative of some configurations and embodiments that fall within the scope of the claims of the application.

What is claimed is:

1. A method comprising:
   providing a substrate comprising plurality of pillars and one of (i) a conductive trace or (ii) a plurality of conductive pads, wherein a first end of individual pillars of the plurality of pillars is coupled to one of (i) the conductive trace or (ii) a corresponding conductive pad of a plurality of conductive pads;
   attaching a first chip to the substrate adjacent to a first side of the plurality of pillars;
   attaching a second chip to the substrate adjacent to a second side of the plurality of pillars, wherein the second side is opposite to the first side;
   disposing an epoxy molding compound over at least the first chip, the second chip, and the plurality of pillars to provide a cover;
   forming a trench in the cover; and
   filling the trench with a conductive material, wherein:
   a second end of each pillar of the plurality of pillars is at least adjacent to the trench defined within the cover,
   a spacing among the plurality of pillars is at least equal to a distance sufficient to block one or more of (i) electromagnetic interference (EMI) or (ii) radio frequency interference (RFI) between the first chip and the second chip,
   the individual pillars of the plurality of pillars are arranged in a preselected manner for one or more frequencies associated with an interference between the first chip and the second chip; and
   the plurality of pillars are positioned to substantially shield the interference at the one or more frequencies between the first chip and the second chip.

2. The method of claim 1, wherein providing the substrate comprising the conductive trace and the plurality of pillars comprises:
   providing the substrate; and
   forming the plurality of pillars and the one of (i) the conductive trace or (ii) the plurality of conductive pads.

3. The method of claim 2, wherein the first end of individual pillars is integral with the one of (i) the conductive trace or (ii) the corresponding conductive pad of a plurality of conductive pads.

4. The method of claim 1, wherein forming the trench comprises:
   placing a fin in the cover during the disposing the epoxy molding compound; and
   removing the fin to provide the trench.

5. The method of claim 1, wherein:
   the second end of the individual pillars of the plurality of pillars engages a bottom surface of the conductive material.

6. The method of claim 5, wherein an outer surface of the cover includes a layer of the conductive material.

7. The method of claim 1, wherein the cover extends to the substrate.

8. The method of claim 1, wherein the corresponding conductive pad of a plurality of conductive pads is exposed at a surface of the substrate.

9. The method of claim 8, wherein the first end of the individual pillars is integral with the one of (i) the conductive trace or (ii) the corresponding conductive pad of the plurality of conductive pads.

10. The method of claim 1, wherein a material of the cover extends between the plurality of pillars.

11. The method of claim 1, wherein the individual pillars of the plurality of pillars are arranged linearly between the first chip and the second chip.

12. The method of claim 1, wherein a spacing between the first chip and the second chip is in a range of 100 microns and 2000 microns.

\* \* \* \* \*